SEMICONDUCTOR DEVICE WITH SURFACE ELECTRODE PRODUCING ELECTROSTATIC FIELD AND CIRCUITS THEREFOR

Original Filed Feb. 28, 1957 2 Sheets-Sheet 1

INVENTOR.
JOHN TORKEL WALLMARK
BY
W.S. Hill
AGENT

INVENTOR:
JOHN TORKEL WALLMARK
BY W. S. Hill
AGENT

United States Patent Office 3,097,308

Patented July 9, 1963

3,097,308

SEMICONDUCTOR DEVICE WITH SURFACE ELECTRODE PRODUCING ELECTROSTATIC FIELD AND CIRCUITS THEREFOR

John T. Wallmark, Princeton, N.J., assignor to Radio Corporation of America, a corporation of Delaware Continuation of applications Ser. Nos. 643,008 and 643,016, Feb. 28, 1957. This application Mar. 9, 1959, Ser. No. 798,129

23 Claims. (Cl. 307—88.5)

This is a continuation of U.S. patent applications, now abandoned, Serial Nos. 643,008 and 643,016, both filed February 28, 1957, by John T. Wallmark, the applicant herein, and assigned to the same assignee as the assignee herein.

This invention relates to semiconductor devices of the rectifying junction type and to circuits therefor; and particularly to junction-type germanium transistors having control means for selectively varying the current-transfer ratio thereof; and to similar devices having a current-transfer ratio that is substantially independent of emitter current.

Devices of the type to which this invention pertains comprise, in general, a body of semiconductive material such as germanium or other suitable semiconductive material having emitter, collector and base regions, and emitter, collector and base electrodes respectively therefor. In operating such devices as signal amplifiers, for example, signals are impressed between the emitter and base, and amplified replicas of the signal are obtained in a utilization circuit connected between the collector and base. The gain obtained may be current or power or both. This current gain is measured by the current-transfer ratio or current-amplification factor, designated $\alpha_{cb}$, which is the ratio of collector current to emitter current at constant collector voltage and constitutes an important parameter of the semiconductor device.

It has been observed in junction-transistor devices, both of the grown-junction and alloy-junction types, that as the emitter current is increased, the current-amplification factor rises initially, passes through a maximum and then decreases steadily. This variation in current-amplification factor is troublesome in transistors, particularly in power transistors operating with high-amplitude signals, where the fall-off in current amplification may be so severe as to effectively limit the usefulness of the device. For example, this variation is a source of distortion which increases rapidly with signal level and, as such, is an important consideration in the design of audio output amplifiers. Even small signal operation may be affected since the gain of the amplifier will vary appreciably with bias currents.

It has been proposed to connect several semiconductor devices in cascade to serve as multistage amplifiers for example. It has also been proposed to prepare a unitary semiconductor device capable of performing the functions of several discrete semiconductor units. For example, it has been suggested that if a mixing or modulating action is desired, two emitter regions may be prepared in an alloy-junction device, these emitter regions being cooperatively associated with a single collector region. Signals are then independently fed to each of the emitter electrodes, and a composite signal is obtained at the collector electrode. Where more than one emitter is used, it is necessary to provide a precise control mechanism for selecting the emitter to be made operative. Such devices are relatively difficult to fabricate, requiring precise positioning and somewhat critical alloying techniques. Furthermore, these devices are relatively inefficient in operation because good transistor action and good control action have opposing requirements of structure geometry.

According to present views, the variation in the current-amplification factor or current-transfer ratio is a result of several related effects; the surface recombination velocity, that is, the rate at which minority carriers injected by the emitter combine with majority carriers present in the surface of the base region adjacent the emitter, thereby resulting in a loss of current; volume recombination velocity, the rate of recombination occurring within the bulk of the semiconductor body during transit of the minority carriers from emitter to collector; and the electric field strength present in the base region, which is a function, among other things, of the emitter current.

Heretofore, volume recombination effects have been minimized by, within feasible limits, decreasing the spacing between the emitter and collector regions. It has also been proposed to minimize the surface recombination velocity, i.e., minimize electron-hole recombination at the surface of the semiconductor body. Thus, S. G. Ellis in U.S. patent application Serial No. 426,873, filed April 30, 1954, now abandoned, and assigned to the assignee of this invention, has provided a method for reducing the surface recombination velocity of charge carriers in a germanium semiconductive material by a specific chemical treatment of the recombination surface and thereby increase the initial value of the current-amplification factor. For as the emitter current is increased, the current-transfer ratio becomes less stable, decreasing steadily in value. Depending upon the circuit application, and particularly for high-emitter-current devices, constancy of the current-transfer ratio may be more important than high initial value of this ratio.

I have discovered that by utilizing the aforesaid surface treatment and providing one or more control electrodes biased with respect to a single pair of emitter and collector electrodes, the surface recombination velocity may be selectively and controllably varied to provide novel semiconductor devices. The single-emitter, single-collector devices of this invention may be used as demodulators, modulators, mixers, gain control and gating devices.

Accordingly, one object of the present invention is to provide improved semiconductor devices.

A further object is to provide improved germanium junction-type semiconductor devices having controllable surface-recombination characteristics.

A further object is to provide a plurality of control electrodes for selectively and controllably varying the current characteristics of a transistor device.

An additional object is to provide unitary semiconductor devices useful for signal mixing and modulation.

A further object is to provide improved germanium junction-type semiconductor devices having a relatively small variation in current-amplification factor with increase in emitter current.

A further object is to provide transistor devices particularly suitable for use as a power transistor operated over a high amplitude range of emitter currents.

A further object is to provide improved methods for controlling the fall-off in the current-transfer ratio of a germanium transistor device.

According to this invention, the surface of a semi-conductor device adjacent the emitter and base regions has a genetically derived insulating layer thereon, preferably having a predetermined thickness. A control electrode is disposed over this genetic layer. In operation, the control electrode is biased either at the same potential as, or independently, of the emitter. Where the control electrode is biased at the same potential as the emitter, the device exhibits only a small variation in current-amplification factor with increase in emitter current. Where the control electrode is independently biased the surface-recombination characteristic of the device is selectively altered providing an additional signal input means. A plurality of such control electrodes are provided, each independently biased, for providing a plurality of controls and/or signal input means.

A typical device herein comprises a germanium alloy-junction transistor having a genetically-derived hydrated germanium oxide layer on the surface of the base region adjacent the emitter electrode, and one or more metal electrodes, such as aluminum electrodes, on this oxide layer. When a control electrode is biased at the same potential as the emitter electrode, the circuit may be built into the device.

Circuits herein comprise a device herein together with means for biasing the control electrode for establishing an electric field at the semiconductor surface which in turn acts to control the current flow through the device.

Other objects and features of this invention will appear from the following description of illustrative embodiments thereof taken in conjunction with the appended drawing in which.

Similar elements are designated by similar reference characters throughout the drawing.

Figure 1:
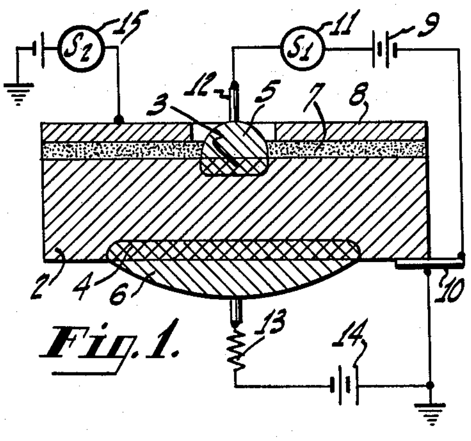
FIGURE 1 is a cross-sectional elevational view of one embodiment of an alloy-junction transistor according to the instant invention, including a schematic representation of a circuit in which this transistor may be used.

Referring to FIGURE 1, an alloy-junction transistor device is shown. The semiconductor body 2 preferably consists of a wafer of germanium or other suitable semiconductive material. For purposes of illustration the semiconductor body 2 will be considered as consisting of a single crystal of germanium doped so as to have n-type conductivity. As is common terminology in this art, a semiconductor of the n-type refers to material containing an excess of electrons, whereas p-type material contains a deficiency of electrons. This deficiency of electrons is frequently referred to as an excess of "holes" or of effective positive charges.

Such an n-type crystal may be obtained by growing a crystal of germanium of high purity from a melt containing a predetermined quantity of an n-type conductivity-determining impurity such as antimony, phosphorus, arsenic or bismuth. Where it is desired to obtain p-type germanium, the semiconductor body is preferably grown from a melt containing a p-type conductivity-determining impurity such as aluminum, gallium, indium, or boron.

The wafer used is cut from a single crystal of n-type germanium having a resistivity preferably between 1 and 3 ohm-cm. and may be about 0.125 x 0.125 x .01 inch thick. The germanium is etched initially in a hydrofluroic acid-nitric acid solution to reduce the thickness to about .006 inch and to expose a fresh, clean crystallographically undisturbed surface. Electrode-forming pellets are placed in alignment with each other upon opposite surfaces of the wafer. These are preferably of a material such as indium or an alloy thereof to impart p-type conductivity. The ensemble is heated in an inert or reducing atmosphere for five minutes at about 500° C. to melt the pellets and to alloy them into the wafer.

During this alloying process, some of the germanium dissolves in the electrode pellet. Upon cooling, it recrystallizes as part of the single crystalline structure of the germanium body 2. These recrystallized regions of germanium, 3 and 4, containing the p-type impurity thus become integral crystalline parts of the germanium body, forming p-n rectifying junctions therein. The pellet material attached to the rectifying junctions 3 and 4 serve as electrodes 5 and 6 therefor. Preferably the smaller recrystallized region 3 is operated as the emitter region, and the larger recrystallized region 4 is operated as the collector region. Thus the dot or pellet used to form emitter electrode 5 usually has a diameter of 0.015 inch, and the dot used for collector electrode 6, 0.045 inch.

In order to control the surface-recombination velocity and thereby influence the current-transfer ratio, a dual layer is provided on the surface of the semiconductor body adjacent the emitter electrode. The layer immediately adjacent the surface of the semiconductor body is an insulating barrier layer 7 genetically derived therefrom; that is, it is a genetic layer formed by chemical treatment of the semiconductor surface itself and not by deposition of an artificial layer thereon.

I have discovered that if a conductive control electrode 8 is disposed over this genetic layer in intimate contact therewith and closely surrounding the emitter electrode 5, but not in contact therewith, this control electrode being substantially coextensive with the surface of the semiconductor body adjacent the emitter electrode 5, and the control electrode is separately biased, the current flow through the device may be controlled independently of the emitter potential. Thus for n-type germanium, increasing the positive bias on the control electrode will markedly lower the surface-recombination velocity, thereby providing for a greater flow of minority carriers reaching the emitter electrode.

In other embodiments of this invention, a plurality of control electrodes may be used, as illustrated, to selectively control the surface-recombination characteristics. As mentioned, artificial insulating layers have been found unsuitable for the purposes of this invention, having but a negligible effect; it is therefore considered an essential feature of this invention that the insulating layer 7 on the surface of the semiconductor body be genetically derived therefrom. The thickness of the insulating layer 7, for predetermined circuit parameters, must be correlated with the field established by the control electrode 8 in order to operate over the usable characteristics of the current-amplification factor vs. emitter current curve. Thus a preferred thickness for normal operation is between 100 and 5,000 angstroms.

In the pending application of S. G. Ellis, hereinbefore referred to, a method is described for forming a film consisting principally of a hydrated germanium monoxide on a germanium surface by etching the surface with a hydrofluoric acid-hydrogen peroxide solution. This surface film is preferably formed after the rectifying p-n junctions have been alloyed to the semiconductor body. However, the semiconductor body may first be treated to form the barrier film thereon and then the rectifying electrodes alloyed thereto penetrating the insulating film and forming rectifying junctions.

Prior to forming the germanium oxide film on the semiconductor surface it is desirable to first etch the device in any of several known etchants in order to remove contaminating matter present on the surface. A suitable etchant comprises a solution containing 28 ml. concentrated hydrofluoric acid, 28 ml. concentrated nitric acid and 12 ml. distilled water. Another such suitable etchant may comprise a solution of 50% potassium hydroxide in water in which the device is etched electrolytically while biasing the p-type regions positive. The device is then rinsed in distilled water and dried. Thereafter, to form the insulating barrier layer, the device is immersed in a solution comprising 40 ml. concentrated hydrofluoric acid, 6 ml. of 30% hydrogen peroxide and 24 ml. water. This solution serves to form the germanium monoxide film. The constituent portions of this solution are not critical except as to the upper limit of the hydrogen peroxide concentration. Thus the hydrogen peroxide concentration of the solution may be greatly reduced without adversely affecting the results obtained. For example, with the solution containing 40 ml. of concentrated hydrofluoric acid, as little as 16 drops of 30% hydrogen peroxide may be used, with no added water. It will be apparent that in solutions including the relatively high hydrogen peroxide concentration, the device will be immersed for a relatively short length of time, preferably not longer than two to five seconds.

The film formed by the foregoing treatment is a visible, continuous, protective film upon the germanium surface of the device. The thickness of the film should be between about 10 and 5,000 angstroms. Such a layer may be built up in from five to thirty seconds. It will be appreciated that if the film is excessively thick it will have poor mechanical properties and be subject to cracking and the like, whereas too thin a layer or film may break down under an applied electric field. In general, it has been found desirable that the resistance of the genetic insulating layer between the metallic control electrode and the germanium body should exceed several megohms when a voltage of 100 millivolts is applied to the genetic layer.

Although the exact chemical composition of the film formed is not known, it is believed to consist principally of a hydrated form of germanium monoxide. What is considered important for the purposes of this invention is that the insulating film be a genetic one, integrally associated with the germanium surface, being genetically derived from the germanium semiconductor body by chemical treatment of the surface. As mentioned, artificially deposited insulatinng films have been found to be unsuitable for the purposes of this invention. It is believed that with artificially deposited insulating films, a surface discontinuity is formed between the germanium semiconductor body and the deposited layer across which the control electrode cannot establish an effective electric field.

As mentioned, a genetically derived hydrated germanium monoxide layer is considered preferable for the purposes of this invention. Another highly satisfactory layer is a genetic germanium dioxide film formed by anodic oxidation of germanium in a 0.25 normal sodium acetate solution in acetic acid.

Other genetically derived layers may be used. Thus the germanium surface may be exposed to other liquid etchants, vapors and gases in order to alter the surface characteristics thereof and form a genetically derived insulating layer. Oxidizing agents other than those described may be used, such as acidified potassium iodide in hydrogen peroxide, or bromine, or the like, or the surface may be sulfided or selenided by exposure to hydrogen sulfide or hydrogen selenide gas, respectively. In a similar manner the surface to be treated may be exposed to the fumes of concentrated hydrofluoric acid either in lieu of the hydrogen peroxide treatment or as a supplement thereto. As mentioned, only insulating barrier layers genetically derived by chemical treatment of the surface have been found effective in the practice of this invention.

While for the purposes of this invention, it is only necessary that the genetic insulating layer be formed on the surface of the base region adjacent the emitter electrode, it may be simpler and more convenient to apply the genetic layer simultaneously to both major surfaces of the germanium body. Thus the genetic layer may also be disposed over the surface adjacent the collector region. This dual-sided genetic layer may be used, for example, for the embodiment shown in FIGURE 1, although not illustrated therein. It will be readily apparent that where it is desired to restrict the presence of the layer to a specific area, the surface that is not to be treated may be masked with a lacquer or wax during the process of forming this insulating layer on the unmasked area.

After the barrier layer has been formed, control electrode 8 is deposited thereover. This electrode serves to establish an electric field in the genetic layer 7 adjacent the surface of the semiconductor body thereby controlling the velocity of electron-hole recombination at this surface. This control electrode may conveniently be formed by evaporating a metal, such as aluminum for example, on top of the insulating barrier layer. While this method is preferable, it is also possible, however, that an electrically conductive foil such as a thin film of aluminum or copper or the like pressed in contact with the insulating layer may be used. An evaporated layer is preferred because this establishes the most intimate contact between the insulating barrier layer and the conductive control electrode thereby establishing an effective field at the germanium surface. If the field-establishing control electrode is too remote from the germanium surface, a less effective field will be established for the same applied potential. Thus the thickness of the insulating layer may serve to determine the spacing of the field-control electrode from the germanium surface.

In addition to the spacing function, the thickness of the insulating layer is important per se in that it determines the portion of the current-amplification factor vs. emitter current curves where $s$, the surface-recombination velocity, is changed from a high to a low value with increasing emitter current. By changing $s$ from a high to a low value, the current-transfer ratio remains substantially constant. This is described more fully with respect to FIGURE 9.

It is further important in the practice of this invention that the field-establishing control electrode be maintained at substantially the same potential as the emitter electrode, so that changes in emitter potential are concurrently seen as changes in control electrode potential. This, of course, can be most conveniently attained by integrally connecting the control electrode and the emitter electrode in a unitary structure, as by simultaneously evaporating a metallic layer both upon the insulating layer and also upon the emitter dot electrode.

This constant current-transfer ratio can also be attained even where an actual difference of potential exists between the emitter and control electrodes provided that the control electrode potential varies in the same manner as the emitter potential. However, as mentioned, it is preferred to maintain both the control and emitter electrodes at substantially the same potential.

As shown in FIGURE 1, the emitter electrode 5 is biased in the high conductivity direction. In this instance, where the base region is n-type, connection is made to the positive terminal of a source of potential such as a battery 9, the negative terminal of which is connected to a base tab connection 10 which is ohmically connected to the semiconductor body and to ground. Variable biasing means, such as a first signal source 11 may be applied between the positive terminal of battery 9 and the emitter lead 12. The collector electrode 6 is negatively biased in the high resistance direction by connection to resistor 13 and then the negative terminal of battery 14, the amplified signal output being derived across resistor 13. The positive terminal of the collector biasing means 14 is connected to base tab 10 and to ground as illustrated.

It has been found that when control electrode 8 is not physically or electrically connected to emitter electrode 3, it may be separately and independently biased to control the surface-recombination velocity and thereby vary the current-transfer ratio of the semiconductor device. Thus by providing a variable second biasing means, such as a separate biasing source and signal source 15 connected to the control electrode 8, the transistor device may be operated as a multi-input device for mixing purposes.

During operation of this device with independently controllable signal sources 11 and 15, intermixing of the two signals occurs, with the composite signal being obtained across resistor 13 in the collector circuit. Also, depending upon the relative magnitudes and frequencies of the signals used and the mode of operation involved, the signal sources may coact to have the semiconductor device operable as a modulator or for gating purposes.

Figure 2:
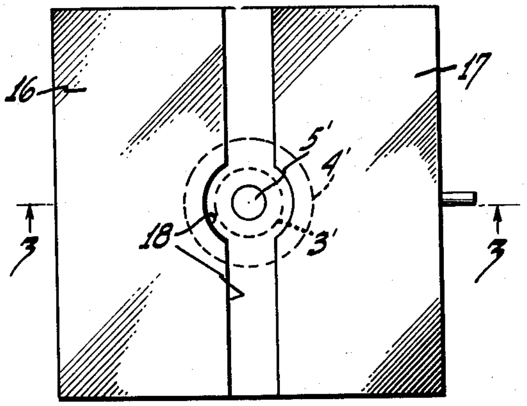
FIGURE 2 is a plan view of a junction transistor having a pair of control electrodes.
Figure 3:
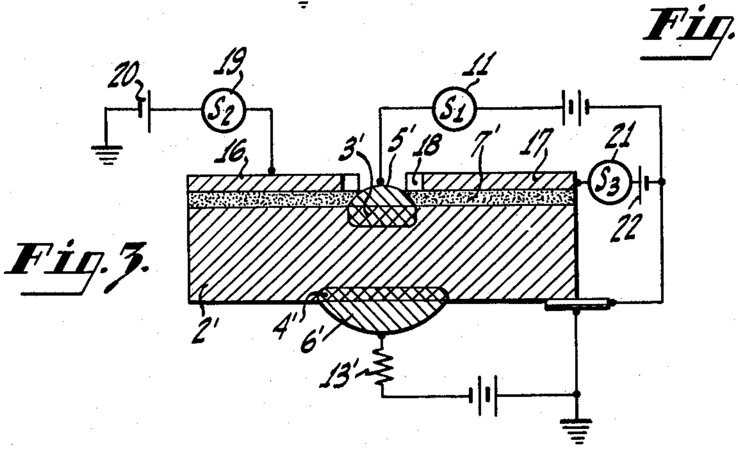
FIGURE 3 is a cross-sectional elevational view taken along the lines 3—3 of the embodiment of FIGURE 2 of an alloy-junction transistor according to the instant invention, and further including a schematic representation of a circuit in which this transistor may be used.

Referring to FIGURES 2 and 3, another embodiment of an alloy-junction transistor device illustrating the principles of this invention is shown. A semiconductor body 2′ is prepared in a manner similar to that heretofore described for the device shown in FIGURE 1. Similarly, emitter and collector electrodes 5′ and 6′ are formed. The insulating genetic layer 7′ may also preferably be a layer of a hydrated germanium oxide as previously described. However, for control purposes two control electrodes, 16 and 17, are provided. These electrodes are preferably of aluminum, and disposed over the genetic layer in intimate contact therewith and closely surrounding the emitter electrode. With the exception of a slot or aperture 18 that is provided to separate the electrodes 16 and 17, these electrodes are substantially coextensive with the surface of the semiconductor body adjacent the emitter electrode 5′. Each of the control electrodes may be separately biased and controlled independently of the emitter potential. Thus signal source 19 is connected to control electrode 16 and has its separate biasing means 20. Similarly, signal source 21 is connected to control electrode 17 and battery 22.

Control electrodes, 16 and 17, operate, in effect, as two independent input grids wherein slight changes in their biasing potentials markedly influence the current-transfer ratio, which, in turn, depends upon the emitter injection action under the influence of emitter signal source 11′. Thus it has been found that by applying a relatively small voltage of, for example, 40 millivolts to a control electrode, the surface-recombination velocity under the genetic layer to be controlled changes by a factor of 3. This would correspond to a change in the current-transfer ratio and thereby the over-all gain of the transistor of between 50 and 100%. It is, of course, envisaged that with special construction techniques the magnitude of these gains may be still further increased. The composite signal output which may be a mixed, modulated, demodulated or other type of net signal, depending on the amplitude, frequency and nature of the applied signals S1, S2 and S3, is derived across resistor 13′ of the collector circuit.

Figure 4:
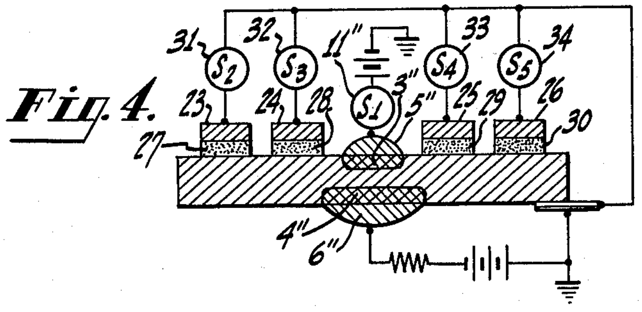
FIGURE 4 is a cross-sectional elevational view of still another modification of the invention having a greater number of control electrodes than shown in FIGURE 2.

In FIGURE 4 is shown a semiconductor device utilizinz four control electrodes 23, 24, 25 and 26 for controlling the surface recombination velocity in the surface immediately adjacent thereto. The semiconductive material use in the semi-conductor device, and the emitter and collector electrodes 5″ and 6″ in operative relation therewith, may be prepared as hereinbefore described. However, although the genetic layer may be a unitary layer coextensive with the surface of the semiconductor body adjacent the emitter electrode, in the embodiment illustrated in FIGURE 4, portions of the surface have been masked prior to chemical treatment of the surface so that the genetic layer is formed as discrete units 27, 28, 29 and 30 disposed between the respective control electrodes 25 and 26 and the surface of the semiconductor body. These control electrodes may be of aluminum and may be deposited by an evaporation technique after the surface has been suitably masked in a manner similar to that used for the preparation of the discrete genetic barrier units.

With the device illustrated, individual signal input means 31, 32, 33 and 34 may be provided for each of the control electrodes. The emitter input signal source 11″ is connected to the emitter electrode, which is biased in the low resistance direction as hereinbefore described. It is preferred in fabricating this semiconductor device that the discrete genetic layers and their associated control electrodes be disposed as close to the emitter electrode as feasible and preferably symmetrically deposited thereabout as, for example, in a wedge-shaped circular formation. Each of the control electrodes together with its associated signal source may be operated so control the surface recombination velocity and thereby influence the current-transfer ratio independently of one another and with negligible coupling effects between the discrete units. Thus many circuit applications heretofore possible only with vacuum tubes or with a plurality of individual semiconductor units may now be obtained using this unitary multicontrol semiconductor device.

Figure 5:
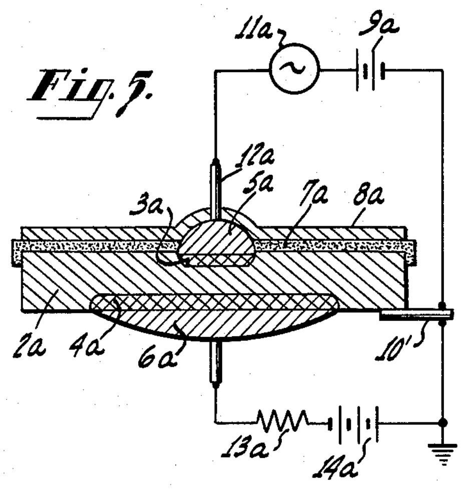
FIGURE 5 is a cross-sectional elevational view of one embodiment of an alloy-junction transistor according to the instant invention, including a schematic representation of a circuit in which this transistor may be used.
Figure 6:
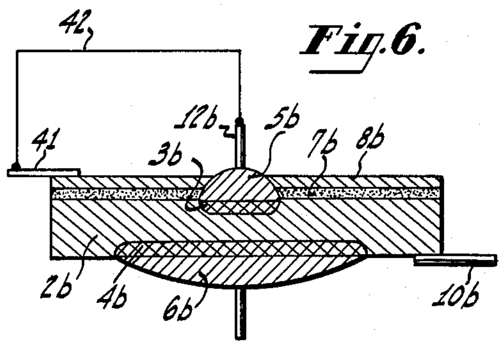
FIGURE 6 is a cross-sectional elevational view of another embodiment of an alloy-junction transistor according to the instant invention.

FIGURES 5 and 6 illustrate an alloy junction transistor device identical with the device of FIGURE 1 except that the control electrode *8a* is electrically connected to the emitter electrode 55 (5 in FIGURE 1). In FIGURE 6, the connection is external to the device through lead 42. In FIGURE 5, the connection is internal and achieved by extending the control electrode *8a* over and in contact with the emitter electrode *5a*.

In FIGURE 5, the emitter electrode *5a* is biased in the high conductivity direction. In this instance, where the base region is n-type, connection is made to the positive terminal of a source of potential such as a battery *9a*, the negative terminal of which is connected to a base tab connection *10a* which is ohmically connected to the semiconductor body and to ground. A signal source *11a* may be applied between the positive terminal of battery *9a* and the emitter lead *12a*. The collector electrode *6a* is negatively biased in the high resistance direction by connection to resistor 13 and then to the negative terminal of battery *14a*, the amplified signal output being derived across resistor *13a*. The positive terminal of the collector biasing means *14a* is connected to the base tab *10a* and to ground as illustrated.

I have discovered that if the control electrode *8a*, is in electrical contact with the emitter electrode *5a* and preferably coextensive with the surface of the semiconductor body adjacent the emitter electrode *5a*, and when maintained at the same potential as the emitter electrode *5a*; then the variation of current-amplification factor of the device is relatively independent of emitter current, i.e., relatively little falloff occurs.

In FIGURE 6, control electrode *8b* overlies insulating layer *7b* but is not connected to emitter electrode *5b* although in close proximity thereto. Control tab 41 is connected to the control electrode *8b*, and external lead 42 is used to connect the control electrode to emitter lead *12b*. The device shown in FIGURE 6 is operated in substantially the same manner as that illustrated in FIGURE 5.

Figures 7, 8, 9:
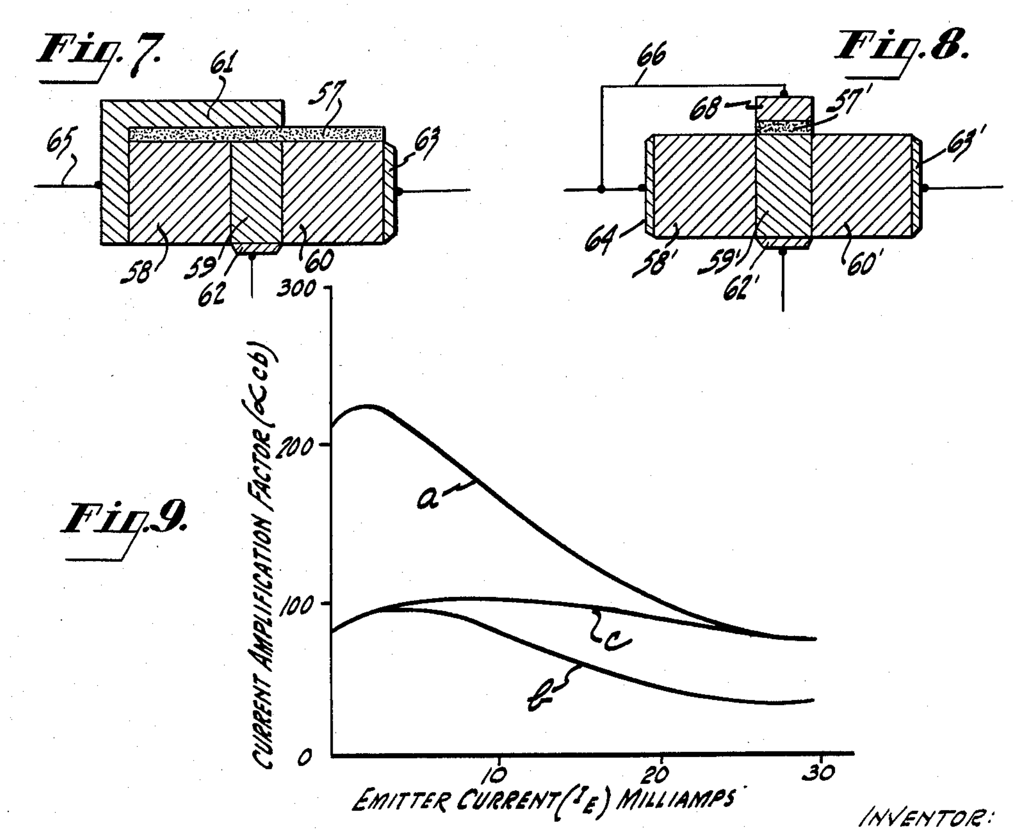
FIGURE 7 is a cross-sectional elevational view of an embodiment of a grown-junction transistor according to this invention.
FIGURE 8 is a cross-sectional elevational view of an additional embodiment of a grown-junction transistor.
FIGURE 9 is a graphical representation of the variation of the current-amplification factor with emitter current for several junction transistors.

FIGURE 7 illustrates an embodiment of a grown-junction transistor according to this invention. The transistor shown may be grown from a melt by conventional crystal-growing techniques, such as the Czochralski crystal-pulling method. As a single crystal of a given conductivity type is grown from the melt, a known amount of an impurity of opposite conductivity type is added to the melt during the crystal-growing process. After a region of this opposite conductivity type has been grown, the melt is again doped to revert its conductivity type to the original conductivity type, without interrupting the crystal-growing process. Thereby an npn or pnp crystal with a region of one conductivity type disposed between two regions of opposite conductivity type is formed.

The semiconductor grown-junction device is formed by slicing the larger grown crystal into dice or cubes of suitable size. For purposes of illustration, a grown junction device of the pnp type is shown with emitter region 58, base region 59 and collector region 60. This grown junction crystal may then have a major surface thereof treated with a suitable chemical substance as hereinbefore described to form a suitable genetic insulating layer 57 thereon.

The portion of the crystal corresponding to the collector region 60 is then suitably masked and a layer 61 of aluminum or similar conductive material deposited thereon, by evaporation, for example. As shown in this figure, this layer 61 would cover the barrier layer disposed over the surface of the base and emitter regions of the crystal but would not cover the portion of the insulating layer adjacent the collector region.

Layer 61 by being deposited directly on the surface of the emitter region 58 as well as over insulating layer 57 simultaneously serves as both emitter and control electrodes. Lead 65 serves as the emitter lead. The unitary control-emitter electrode would be operated in a similar manner as that described for the device shown in FIGURE 1, i.e., to control the velocity of electron-hole recombination at the surface of the device during the passage of minority carriers from the emitter region through the base region to the collector region. Low resistance ohmic contacts 62 and 63 serve as base electrode and collector electrode respectively, making contact with the base and collector regions 59 and 60.

FIGURE 8 illustrates a grown-junction transistor prepared in a similar manner to that illustrated in FIGURE 7. However, in preparing this device, both emitter and collector regions 58′ and 60′ are suitably masked so that the genetically derived insulating layer 57′ is formed only on a surface of the base region 59′. Control electrode 68 is then deposited as a metallic layer only over the insulating layer 57′, and lead 66 is then externally connected to emitter electrode 64. Low resistance ohmic contacts 62′ and 63′ serve as base and collector electrodes respectively, making contact with the base and collector regions 59′ and 60′.

FIGURE 9 is a group of curves illustrating fall-off of the current-amplification factor or current-transfer ratio as a function of emitter current. The current-amplification factor used herein for purposes of measurement corresponds to that designated as $\alpha_{cb}$ or the current transfer ratio between the collector and base electrodes. This parameter is a more sensitive one than the parameter known as $\alpha_{ce}$, the variation of collector current in response to a change in emitter current at constant collector voltage. $\alpha_{cb}$ is also easier to measure more accurately than $\alpha_{ce}$ thereby making for more reliable comparison between data.

Curve *a* shows a characteristic fall-off in current-transfer ratio of a device having a surface-recombination-inhibiting layer thereon. Such a device has a low value of surface-recombination velocity. Curve *b* shows the characteristic curve for a device having a high surface-recombination velocity, such as an untreated device. As may be noted from curves *a* and *b*, the initial value of $\alpha_{cb}$ has been increased by use of the surface-recombination-inhibiting layer; however, both curves show a fairly similar rate of fall-off of $\alpha_{cb}$, alpha becoming markedly lower at high emitter currents. Curve *c* represents the characteristics obtained by using, in accordance with the teachings of this invention, a control electrode maintained at emitter potential. Thus curve *c* starts at the initial value of curve *b*, which is characteristic for a high surface-recombination velocity, and terminates, at high emitter current values, at curve *a*, which is characteristic for a low surface-recombination velocity. Thus curve *c* effectively represents a transfer from curve *b* to curve *a*. Hence, as shown, even for high values of emitter current up to 30 milliamperes, the current-amplification factor has a substantially constant value. As mentioned, for various circuit applications constancy of alpha is of importance without regard to a very high initial value of surface-recombination velocity. It should be noted that the stabilized value of alpha for curve *c* is nonetheless a high one, approximately 85.

It is believed that the foregoing performance is obtained as follows: as the emitter current increases, the potential on the control electrode also increases since this electrode is electrically connected to the emitter electrode. Because of this higher potential on the control electrode, the surface becomes more highly charged. Since the polarity of the surface charge is the same as that of the minority carriers injected by the emitter, fewer minority carriers combine with majority charges present in the semiconductor surface and thus these additional minority charge carriers are available for current condition to the collector electrode. Thus the current-transfer ratio remains substantially constant for increasing emitter currents.

It will be readily apparent to those skilled in the art of fabricating semiconductor devices that various changes may be made in the structures herein described without departing from the spirit of this invention. Thus while I have described above the principles of this invention in connection with specific devices, it is to be clearly understood that the description is made only by way of example and not as a limitation to my invention.

What is claimed is:

1. A semiconductor device comprising a semiconductor body having emitter and collector regions in contact therewith for injecting into and collecting minority carriers from said body, a base electrode contacting said body, said emitter region contacting a surface of said body, said emitter and collector regions defining the ends of a current path through said body substantially normal to said surface, a genetic insulating layer derived from said body covering at least a portion of said surface of said semiconductor body adjacent said emitter region, a control electrode adjacent said genetic layer for establishing an electric field therein for controlling the velocity of electron-hole recombination at said surface of said body, and means for independently biasing said control electrode.

2. A semiconductor device of the rectifying junction type comprising a semiconductor body having emitter, collector and base regions, a base electrode contacting the base region of said body, said emitter region contacting a surface of said base region, said emitter and collector regions defining the ends of a current path through said base region substantially normal to said surface, a genetic insulating layer derived from said base region covering at least a portion of said surface of the base region of said semiconductor body adjacent said emitter region, a control electrode adjacent said genetic layer for establishing an electric field therein for controlling the velocity of electron-hole recombination at said surface of said body adjacent said emitter region, and means for biasing said control electrode independently of said emitter region.

3. A semiconductor device of the rectifying junction type comprising a semiconductor body having emitter, collector and base regions, a base electrode contacting the base region of said body, said emitter region contacting a surface of said base region, said emitter and collector regions defining the ends of a current path through said base region substantialy normal to said surface, a genetic insulating layer derived from said base region covering at least a portion of said surface of the base region of said semiconductor body adjacent said emitter region, a plurality of control electrodes adjacent said genetic layer for establishing an electric field therein for controlling the velocity of electron-hole recombination at said surface of said body adjacent said emitter region, and biasing means associated with each of said control electrodes with respect to one another and said emitter region.

4. A semiconductor device of the rectifying junction type comprising a semiconductor body having emitter, collector and base regions, a base electrode contacting the base region of said body, said emitter region contacting a surface of said base region, said emitter and collector regions defining the ends of a current path through said base region substantially normal to said surface, a plurality of discrete genetic insulating layers each derived from said base region and covering at least portions of said surface of the base region of said semiconductor body adjacent the emitter region, and a plurality of control electrodes each in contact with one of said discrete insulating layers for establishing an electric field therein for controlling the velocity of electron-hole recombination at said surface of said body adjacent said emitter region.

5. The device of claim 4 further including means associated with each of said control electrodes for independently varying the potential of said electrodes with respect to one another and said emitter region.

6. An alloy-junction transistor device comprising a germanium body of N-type conductivity, emitter and collector regions in contact therewith, a base electrode contacting said body, said emitter region contacting a surface of said body, said emitter and collector regions defining the ends of a current path through said body substantially normal to said surface, a genetic insulating layer derived from said body including a hydrated germanium oxide as a major constituent thereof covering at least a portion of said surface of said germanium body adjacent said emitter electrode, a plurality of control electrodes adjacent said insulating layer for establishing an electric field therein for controlling the velocity of electron-hole recombination at said surface of said body adjacent said emitter region, and means for biasing each of said control electrodes to selectively vary the flow of current within the semiconductor body.

7. An alloy-junction transistor device comprising a germanium body of N-type conductivity, emitter and collector regions in contact therewith, a base electrode contacting said body, said emitter region contacting a surface of said body, said emitter and collector regions defining the ends of a current path through said body substantially normal to said surface, a plurality of discrete genetic insulating layers each derived from said body including a hydrated germanium monoxide as a major constituent thereof covering at least a portion of said surface of said N-type germanium body adjacent said emitter region, a plurality of control electrodes each adjacent one of said discrete insulating layers, and signal means associated with each of said control electrodes for independently varying the potential of said electrodes with respect to one another and said emitter region.

8. The device of claim 7 wherein each of said control electrodes is a layer of aluminum deposited over each said insulating layers and in intimate contact therewith.

9. An alloy-junction transistor device comprising a germanium body of N-type conductivity, emitter and collector regions in contact therewith, a base electrode contacting said body, said emitter region contacting a surface of said body, said emitter and collector regions defining the ends of a current path through said body substantially normal to said surface, a plurality of discrete genetic insulating layers each derived from said body including a hydrated germanium dioxide as a major constituent thereof covering at least a portion of said surface of said N-type germanium body adjacent said emitter region, a plurality of control electrodes each adjacent one of said discrete insulating layers, and signal means associated with each of said control electrodes for independently varying the potential of said electrodes with respect to one another and said emitter region.

10. A semiconductor device of the rectifying junction type comprising a semiconductor body having emitter, collector and base regions, a base electrode contacting said body, said emitter region contacting a surface of said body, said emitter and collector regions defining the ends of a current path through said body substantially normal to said surface, a genetic insulating layer derived from said base region covering at least a portion of said surface of the base region of said semiconductor body, adjacent said emitter region, and a control electrode upon said genetic layer for establishing an electric field therein for controlling the velocity of electron-hole recombination at said surface of said base region adjacent said emitter region, the potential of said control electrode varying directly with the electric potential of said emitter region.

11. A semiconductor device of the rectifying junction type comprising a semiconductor body having emitter, collector and base regions and respective electrodes therefor, a base electrode contacting said base region, a genetic insulating layer derived from said base region covering at least a portion of a surface of the base region of said semiconductor body adjacent said emitter region, a control electrode in contact with said genetic layer for establishing an electric field therein for controlling the velocity of electron-hole recombination at said surface of said base region adjacent said emitter region, said control electrode being integrally connected to said emitter electrode whereby said control and emitter electrodes are maintained at the same electric potential.

12. An alloy-junction transistor device comprising a germanium body of N-type conductivity, emitter and collector regions in contact therewith, base electrode contacting said body, a genetic insulating layer derived from said body covering at least a portion of the surface of said germanium body adjacent said emitter electrode, and a control electrode in contact with said genetic layer for establishing an electric field therein for controlling the velocity of electron-hole recombination at said surface of said body adjacent said emitter region, said control electrode being maintained at the same electric potential as said emitter region.

13. A semiconductor device comprising a body of semiconductive material having two regions of one conductivity type separated by a region of the opposite conductivity type, said two regions being contiguous with opposite faces of said region of opposite conductivity type, a base electrode contacting said region of opposite conductivity type, a genetic insulating layer covering at least a portion of a surface of said region of opposite conductivity type, and a control electrode in contact with said genetic layer for establishing an electric field therein for controlling the velocity of electron-hole recombination at said surface of said device, said control electrode being maintained at the same potential as one of said regions of same conductivity type.

14. A semiconductor device comprising a body of semiconductive material having two regions of P-type germanium separated by a region of N-type germanium, said two P-type regions being contiguous with opposite face of said N-type region, a base electrode contacting said N-type regions, a genetic insulating layer including a hydrated germanium dioxide as a major constituent thereof covering at least a portion of a surface of said N-type zone, and a control electrode in contact with said genetic layer for establishing an electric field therein for controlling the velocity of electron-hole recombination at said surface of said device, said control electrode being maintained at the same electric potential as one of said P-type zones.

15. A semiconductor device comprising a body of germanium having two P-type regions separated by an N-type region, an emitter electrode in low resistance contact with one of said P-type regions, a collector electrode in low resistance contact with the other of said P-type regions, and a base electrode in low resistance contact with said N-type region, a genetic insulating layer of a hydrated germanium monoxide covering at least a portion of the surface of said germanium body adjacent said N-type region and a layer of aluminum substantially covering said genetic layer and in intimate contact therewith and with said emitter electrode for establishing an electric field for controlling the velocity of electron-hole recombination at said surface of said device.

16. A semiconductor device according to claim 15 wherein said genetic layer has a thickness between 100 and 5,000 angstroms.

17. A semiconductor device comprising a semiconductor body, a non-rectifying electrode attached to said body, a pair of rectifying electrodes attached to said body, one of said rectifying electrodes contacting a surface of said body, said rectifying electrodes defining the ends of a current path in said body substantially normal to said surface, at least one genetic layer of insulating material derived from said body over at least a portion of said surface, and at least one electrode in contact with said layer and electrically isolated from contact with said body.

18. A semiconductor device comprising a semiconductor body of a particular conductivity type and having a pair of opposed surfaces, a non-rectifying electrode attached to said body, a rectifying emitter electrode connected to one of said surfaces, a rectifying collector electrode connected to the other of said surfaces, a genetic layer of insulating material derived from said body over at least a portion of said one surface, and at least one control electrode upon said genetic layer.

19. A semiconductor device comprising a semiconductor body of a particular conductivity type and having a pair of opposed surfaces, a non-rectifying electrode attached to said body, a rectifying emitter electrode connected to one of said surfaces, a rectifying collector electrode connected to the other of said surfaces, a genetic layer of insulating material derived from said body over at least the portion of said one surface adjacent said emitter rectifying electrode and a control electrode upon said genetic layer and substantially coextensive therewith.

20. A semiconductor device comprising a semiconductor body of a particular conductivity type and having a pair of opposed surfaces, a non-rectifying electrode attached to said body, a rectifying emitter electrode connected to one of said surfaces, a rectifying collector electrode connected to the other of said surfaces, a plurality of genetic layers of insulating material each derived from said body on at least a portion of said one surface, and a control electrode upon each of said layers and substantially coextensive therewith, said control electrodes being electrically isloated from said body.

21. A semiconductor device comprising a base having a surface, a rectifying emitter fixed to said surface of said base, and rectifying collector fixed to said base, said rectifying emitter and said rectifying collector defining the ends of a current path substantially normal to said surface, an ohmic base electrode fixed to said base, a genetic layer of insulating material between 10 and 5,000 angstrom units thick derived from said base over said surface of said base adjacent said emitter, and a control electrode over and in contact with said layer of insulating material.

22. A semiconductor device comprising a base having a surface, a rectifying emitter fixed to said surface of said base and a rectifying collector fixed to said base, said rectifying emitter and said rectifying collector defining the ends of a current path substantially normal to said surface, an ohmic base electrode fixed to said base, a genetic layer of insulating material between 10 and 5,000 angrstrom units thick derived from said base over said surface of said base adjacent said emitter, a control electrode over and in contact with said layer of insulating material, and a direct current connection between said emitter and said control electrode.

23. A semiconductor device comprising a base having a surface, a rectifying emitter fixed to said surface of said base and rectifying collector fixed to said base, said rectifying emitter and said rectifying collector defining the ends of a current path substantially normal to said surface, an ohmic base electrode fixed to said base, a genetic layer of insulating material between 10 and 5,000 angstrom units thick derived from said base over said surface of said base adjacent said emitter, a control electrode over and in contact with said layer of insulating material, and a circuit for subjecting the control electrode to a control voltage with respect to said base.

References Cited in the file of this patent

UNITED STATES PATENTS

| | | |
|---|---|---|
| 2,349,622 | Hewlett | May 23, 1944 |
| 2,476,323 | Rack | July 19, 1949 |
| 2,524,035 | Bardeen | Oct. 3, 1950 |
| 2,595,232 | Dimond | May 6, 1952 |
| 2,612,567 | Stuetzer | Sept. 30, 1952 |
| 2,702,838 | Haynes | Feb. 22, 1955 |
| 2,722,490 | Haynes | Nov. 1, 1955 |
| 2,754,431 | Johnson | July 10, 1956 |
| 2,796,562 | Ellis | July 18, 1957 |
| 2,801,347 | Dodge | July 30, 1957 |
| 2,816,850 | Harring | Dec. 17, 1957 |
| 2,870,345 | Overbeek | Jan. 20, 1959 |
| 2,897,377 | Nelson | July 28, 1959 |
| 2,900,531 | Wallmark | Aug. 18, 1959 |
| 2,901,638 | Huang | Aug. 25, 1959 |
| 2,904,704 | Marinace | Sept. 15, 1959 |